(12) United States Patent
Wattyn

(10) Patent No.: US 12,447,733 B2
(45) Date of Patent: Oct. 21, 2025

(54) APPARATUS AND METHOD FOR TREATING A RELIEF PLATE PRECURSOR WITH IMPROVED LIQUID EVACUATION

(71) Applicant: XSYS PREPRESS N.V., Ypres (BE)

(72) Inventor: Bart Marc Luc Wattyn, Dentergem (BE)

(73) Assignee: XSYS PREPRESS N.V., Ypres (BE)

( * ) Notice: Subject to any disclaimer, the term of this patent is extended or adjusted under 35 U.S.C. 154(b) by 157 days.

(21) Appl. No.: 17/914,944

(22) PCT Filed: Mar. 25, 2021

(86) PCT No.: PCT/EP2021/057741
§ 371 (c)(1),
(2) Date: Sep. 27, 2022

(87) PCT Pub. No.: WO2021/198012
PCT Pub. Date: Oct. 7, 2021

(65) Prior Publication Data
US 2023/0145873 A1    May 11, 2023

(30) Foreign Application Priority Data

Mar. 30, 2020    (NL) ...................................... 2025238

(51) Int. Cl.
| | |
|---|---|
| *B65G 49/04* | (2006.01) |
| *B41C 1/00* | (2006.01) |
| *G03F 7/30* | (2006.01) |
| *B41C 1/02* | (2006.01) |
| *B41N 3/00* | (2006.01) |

(52) U.S. Cl.
CPC ............ *B41C 1/00* (2013.01); *B65G 49/0413* (2013.01); *G03F 7/3042* (2013.01); *G03F 7/3057* (2013.01)

(58) Field of Classification Search
None
See application file for complete search history.

(56) References Cited

U.S. PATENT DOCUMENTS 12,078,932 B2 * 9/2024 Wattyn .................. B41N 3/006

FOREIGN PATENT DOCUMENTS

| DE | 202007003195 U1 | 6/2007 |
|---|---|---|
| EP | 0225678 A1 | 6/1987 |

(Continued)

OTHER PUBLICATIONS

International Search Report and Written Opinion for PCT/EP2021/057741 dated Mar. 25, 2021 (nine (9) pages).

*Primary Examiner* — Joshua D Zimmerman
(74) *Attorney, Agent, or Firm* — KDW Firm PLLC

(57) ABSTRACT

An apparatus for treating a relief plate precursor, such as a printing plate precursor, with a liquid, includes a treatment compartment for treating the relief plate precursor with a liquid, and a transport system for use with one or more transport bars. A transport bar thereof is configured to be coupled to a relief plate precursor. The transport system is configured to move the transport bar with the coupled relief plate precursor through the treatment compartment. The transport bar is provided with a coupling portion configured to couple the transport bar to the transport system. A protection system is configured to guide and evacuate liquid such that the transport system is protected against wetting with the liquid of the treatment compartment.

19 Claims, 9 Drawing Sheets

(56) References Cited

FOREIGN PATENT DOCUMENTS

| EP | 1993850 | B1 | 12/2009 |
| EP | 3495890 | A1 | 6/2019 |
| GB | 852153 | A | 10/1960 |
| WO | 2019206911 | A1 | 10/2019 |

* cited by examiner

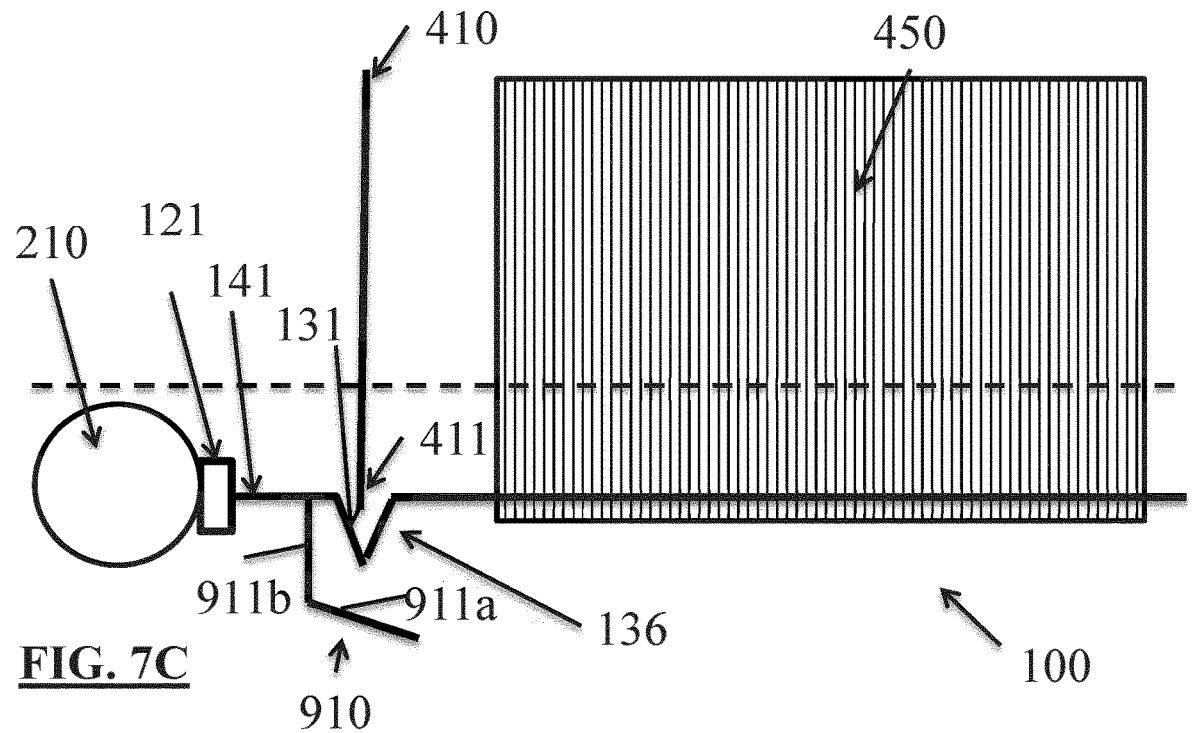
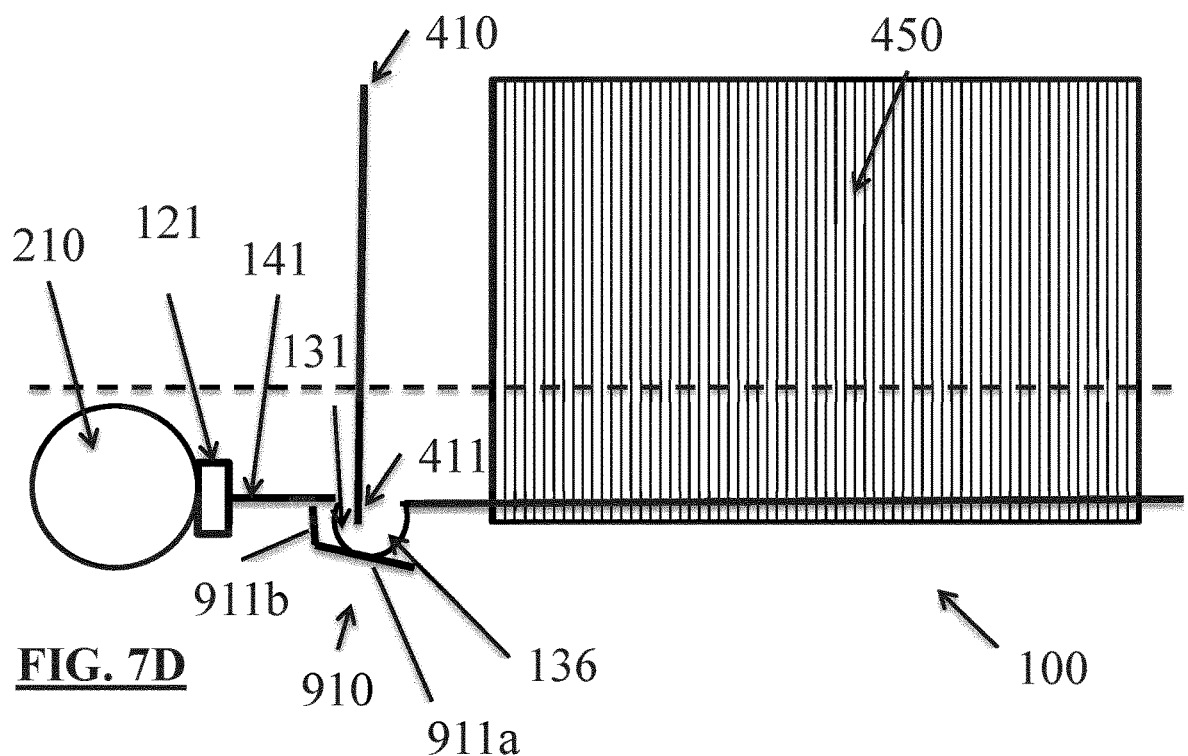

APPARATUS AND METHOD FOR TREATING A RELIEF PLATE PRECURSOR WITH IMPROVED LIQUID EVACUATION

This application is a national stage filing under 35 U.S.C. 371 of pending International Application No. PCT/EP2021/057741, filed Mar. 25, 2021, which claims priority to Netherlands Patent Application No. 2025238, filed Mar. 30, 2020, the entirety of which applications are incorporated by reference herein.

FIELD OF INVENTION

The field of the invention relates to an apparatus and a method for treating a relief plate precursor, in particular a printing plate precursor, with a liquid.

BACKGROUND

Washer apparatus for printing plate precursors are known. Typically, a transport bar is used to move a printing plate precursor through such washer apparatus using a transport system. The washer further uses a liquid to partially remove material from the precursor and in most cases brushes are used to increase the efficiency. Due to splashing and liquid running over the transport bar this transport system may get wetted. Depending on the nature of the liquid this may lead to degradation of the transport system e.g. by corrosion. Another drawback is that during the washing the liquid gets loaded with material of the precursor which may stick to the transport system upon drying and may lead to malfunction.

SUMMARY

The object of embodiments of the invention is to provide an apparatus and method which avoids wetting to the transport system.

According to a first aspect of the invention there is provided an apparatus for treating a relief plate precursor, such as a printing plate precursor, with a liquid. The apparatus comprises a treatment compartment, a transport system with one or more transport bars, and a protection system. The treatment compartment is configured for treating the relief plate precursor with a liquid. A transport bar of the one or more transport bars is configured to be coupled to a relief plate precursor. The transport system is configured to move the transport bar with the coupled relief plate precursor through the treatment compartment. To that end the transport bar is provided with a coupling portion configured to couple the transport bar to the transport system. The protection system is configured to guide and evacuate the liquid such that the transport system is protected against wetting with the liquid of the treatment compartment.

By providing a protection system which is such that it keeps liquid away from the transport system, wetting of the transport system is avoided. Thus, problems related to the wetting of the transport system, such as corrosion or malfunctioning, are avoided or reduced.

Preferably, the protection system comprises a liquid evacuation part extending lengthwise next to the transport system and below an outer end of the transport bar. The liquid evacuation part is provided with an upwardly extending portion at a side facing the transport system. In that manner, the upwardly extending portion will stop liquid flowing over the liquid evacuation part towards the transport system. The other side of the liquid evacuation part which is furthest away from the transport system may extend horizontally or downwardly so that the liquid can be evacuated into a reservoir below the liquid evacuation part. However, it is also possible that the liquid evacuation part consists of the upwardly extending portion only, e.g. an upwardly sloping portion and that this portion alone guides the liquid to a reservoir.

Preferably, the transport bar is provided at the outer end with an upwardly extending portion. In such an embodiment, the upwardly extending portion of the liquid evacuation part extends between the transport system and the upwardly extending portion of the transport bar. In that manner, liquid present on the transport bar will be stopped by the upwardly extending portion of the transport bar, and can flow sideways off the transport bar on the liquid evacuation part where liquid is evacuated to a reservoir as described above.

Preferably, the treatment compartment comprises a wall portion having a lower edge right above the outer end of the transport bar, when the transport bar moves through the treatment compartment. More preferably, the wall portion extends next to the upwardly extending portion of the transport bar such that an upper edge of the upwardly extending portion of the transport bar is higher than the lower edge of wall portion. Also preferably, the liquid evacuation part extends below the lower edge of the wall portion. In that manner, any liquid splashes or drops on the wall portion of the treatment compartment may glide along the wall portion onto the evacuation part or on the transport bar, such that those splashes or drops are evacuated, and are prevented form wetting the transport system. The wall portion may comprise openings configured to allow components of the liquid application means, such as a shaft, to penetrate through the wall portion. The wall portion is typically an upright wall portion, preferably a vertical wall portion.

In a preferred embodiment, the transport bar comprises a bridge portion extending from the upwardly extending portion of the transport bar over the upwardly extending portion of the liquid evacuation part to join the coupling portion. Such bridge portion provides an appropriate connection with the coupling portion.

In an exemplary embodiment, the transport bar is provided at the outer end with an inverse-U-shaped portion having an outer leg forming the coupling portion and an inner leg forming the upwardly extending portion, wherein the upwardly extending portion of the liquid evacuation part extends between the outer and inner leg of the inverse-U-shaped portion. In that manner, the coupling portion can be located at more or less the same height of the main part of the transport bar, such that the force exerted by the transport system on the coupling portion is more or less in the same plane as the plane of the relief plate precursor and the transport bar, thus avoiding that the transport bar starts to turn.

In an exemplary embodiment, the transport bar is provided at the outer end with a substantially U- or V-shaped portion having a downwardly extending inner leg and an outer leg forming the upwardly extending portion, wherein the upwardly extending portion of the liquid evacuation part extends between the outer leg of the substantially U- or V-shaped portion and the coupling portion. In such an embodiment, liquid on the transport bar may flow in the U- or V-shaped portion, and be evacuated sideways from there onto the evacuation part. Also in such an embodiment, the coupling portion can be located at more or less the same height of the main part of the transport bar, such that the force exerted by the transport system on the coupling portion is more or less in the same plane as the plane of the relief plate precursor and the transport bar.

Preferably, the outer end of the transport bar is supported on the liquid evacuation part. The outer end may be supported on a horizontal or inclined portion of the liquid evacuation part or on the upper edge of the upwardly extending portion of the liquid evacuation part.

Preferably, a height of the upwardly extending portion of the transport bar is more than 5 mm, more preferably between 5 mm and 100 mm. Preferably, a height of the upwardly extending portion of the liquid evacuation part is more than 5 mm, more preferably between 5 mm and 100 mm. Preferably, a distance between a lower edge of the upwardly extending wall portion and the liquid evacuation part is smaller than 10 mm, more preferably between 0 mm and 5 mm.

In a preferred embodiment, the transport system is substantially symmetric with respect to a central axis of the apparatus, with a first and second transport mechanism for being coupled to a first and second outer end of the transport bar, respectively. In such an embodiment, the transport bar is provided at the first and a second outer end with a first and second upwardly extending portion, respectively, and the protection system comprises a first and a second liquid evacuation part below the first and the second outer end, respectively, and extending lengthwise next to the first and second transport mechanism of the transport system, respectively. Preferably, the first liquid evacuation part is provided with a first upwardly extending portion extending between the first transport mechanism and the first upwardly extending portion of the transport bar and the second liquid evacuation part is provided with a second upwardly extending portion extending between the second transport mechanism and the second upwardly extending portion of the transport bar. Although such symmetric set-up is generally preferred, it is noted that there may be provided a driven transport mechanism at the first outer end of the transport bar and a simple guide mechanism at the second outer end of the transport bar. Depending on whether such guide mechanism requires protection against wetting, it me be arranged either in a similar manner as the driven transport mechanism with protection system, or without protection system.

Preferably, the transport system comprises a lead screw, preferably a pair of lead screws, or a chain or belt, preferably a pair of chains or belts. Such lead screw or chain or belt extends in the movement direction, one side of the treatment compartment or on either side of the treatment compartment.

Preferably, the treatment compartment comprises a plurality of liquid application means having an axis arranged parallel to the transport bar. Preferably, the transport system comprises a first and a second transport mechanism extending perpendicular on the axis of the liquid application means, at a first and second side of the liquid application means, respectively. Preferably, a coupling location between the transport bar and the first and second transport mechanism is located lower than an upper side of the liquid application means, preferably lower than the axis of the liquid application means. In that manner, the apparatus can be compact, and the transport system can be arranged at a relatively low location in the apparatus.

The liquid application means may comprise rollers, brushes, spraying nozzles, pipes, a table arranged below a roller or brush, and combinations thereof. Preferably the liquid application means are rollers or cylindrical brushes. The brush may be e.g. a movable (rotating or oscillating) brush (flat or cylindrical). A table below a brush or roller may extend with an outer end thereof over the liquid evacuation part, and in particular over a substantially horizontal part thereof. Preferably, the table is positioned at a lower level than an upper edge of the upwardly extending portion of the liquid evacuation part, such that any liquid flowing from the table on the liquid evacuation part is stopped by the upwardly extending portion of the liquid evacuation part.

Preferably, the liquid application means comprises a shaft and a liquid application tool intended to contact the relief plate precursor, such as bristles, arranged on the shaft, and the liquid evacuation part extends below the transport bar and below the shaft of the liquid application means, at a distance of the liquid application tool. In that manner the liquid evacuation part will not hinder the treatment by the liquid application tool, whilst allowing a good evacuation of any liquid on the transport bar.

In an exemplary embodiment, the transport bar is provided with one or more holes for evacuating liquid through said one or more holes. This will further help in evacuating the liquid away from the transport system. The one or more holes are preferably located at least at the lowest part of the transport bar e.g. at the bottom of the U- or V-shaped portion having a downwardly extending inner leg.

Preferably, the liquid evacuation part is made of a metal, an alloy, a plastic resistant to the liquid, or combinations thereof.

Preferably, the transport bar is provided with at least one penetration element, more preferably a plurality of penetration elements. The shape of the at least one penetration element may be selected from a group comprising: a rod with e.g. a round, elliptical, triangular, rectangular or multi-angular cross section, a blade, a needle, or combinations thereof. The at least one penetration element may be made of metal or an alloy.

Preferably, the length of the transport bar is from 100 mm to 10000 mm, more preferably from 200 mm to 5000 mm, most preferably from 500 mm to 3000 mm.

According to a preferred embodiment, the apparatus comprises a plate coupling station and/or decoupling station configured for coupling and/or decoupling the relief plate precursor to or from the transport bar. The plate coupling station may be configured to engage the at least one penetration element in an area near an edge of a relief plate precursor. More preferably, each penetration element has a sharp tip or edge capable of causing a penetrating action in the material of the relief plate precursor, and the plate coupling station is configured to cause a penetration by the at least one penetration element at least partially into or through an unperforated area near an edge of a relief plate precursor. In that manner the penetration elements are pushed in the material of the printing plate without generating waste. However, it is noted that the invention also covers the use of pre-perforated relief plate precursors which are coupled to the transport bar in the plate coupling station.

Preferably, the transport system is configured to move the at least two transport bars in a closed loop through the apparatus. Two, three or more transport bars may be transported simultaneously in the apparatus. For example, one of the at least two transport bars may be transported through the treatment compartment whilst another one is being transported back to the plate coupling station.

The apparatus may further comprise additional components selected form the group comprising: a pump, a filter, a sensor (temperature, solid content, density, pressure, etc.), a gear, a motor, a spraying system, a control unit configured to control one or more components thereof, and combinations thereof.

According to another aspect of the invention there is provided a method for treating a relief plate precursor with a liquid. The method comprises:

- providing a transport bar with a coupling portion configured to couple the transport bar to a transport system, and with at least one penetration element, preferably a plurality of penetration elements, configured to couple the transport bar to a relief plate precursor;
- coupling the relief plate precursor to the at least one penetration element of the transport bar;
- coupling the coupling portion of the transport bar to the transport system;
- controlling the transport system such that the transport bar with the coupled relief plate precursor is moved through a treatment compartment where the relief plate precursor is treated with a liquid;
- evacuating liquid over the transport bar towards a liquid evacuation part whilst the transport bar is moving through the treatment compartment, such that the liquid is evacuated before it can reach the transport system.

Preferably, the liquid evacuation part extends lengthwise next to the transport system and below an outer end of the transport bar, said liquid evacuation part being provided with an upwardly extending portion at a side facing the transport system, such that liquid is stopped at said upwardly extending portion of the liquid evacuation part. More preferably, the transport bar is provided at the outer end with an upwardly extending portion, and the upwardly extending portion of the liquid evacuation part extends between the transport system and the upwardly extending portion of the transport bar, such that liquid is stopped at said upwardly extending portion of the transport bar, and evacuated to a lower reservoir via the liquid evacuation part.

Preferably, the method further comprises decoupling the transport bar from the treated relief plate precursor in a plate decoupling station of the treatment apparatus. Preferably, the transport bar is moved in a closed loop from a plate coupling station through the treatment compartment to the plate decoupling station and back to the plate coupling station. Preferably, at least two transport bars are being transported simultaneously in the treatment compartment. In other words, the transport bar or bars can circulate automatically in the apparatus. An operator may bring the relief plate precursor to be treated to the plate coupling station, and next the coupling, treating and decoupling is performed automatically whereupon the transport bar is automatically returned to the plate coupling station. In that way an operator does not have to decouple or return the transport bar. This reduces the number of required manual interactions.

Preferably, the treatment in the treatment compartment is selected from the group comprising washing, brushing, rinsing, spraying, optionally in combination with any one of the following: developing, heating, cooling, removing of material, treating with gases or liquids, with electromagnetic waves, and combinations thereof.

The method may further comprise the step of performing a post-treatment on the relief plate precursor, said post-treatment being selected from the group comprising washing, brushing, rinsing, spraying, drying, irradiating, developing, heating, cooling, removing of material, treating with gases or liquids, sanding, cutting, treating with electromagnetic waves and combinations thereof. Also, the method may further comprise the step of performing a pre-treatment on the relief plate precursor, said pre-treatment being selected from the group comprising: cutting, ablation, exposure to electromagnetic radiation, and combinations thereof.

BRIEF DESCRIPTION OF THE FIGURES

The accompanying drawings are used to illustrate presently preferred non limiting exemplary embodiments of the apparatus and method of the present invention. The above and other advantages of the features and objects of the invention will become more apparent and the invention will be better understood from the following detailed description when read in conjunction with the accompanying drawings, in which:

FIGS. 7A-7D illustrate side view of four further exemplary embodiments of an apparatus for treating a relief plate precursor.

DETAILED DESCRIPTION OF EMBODIMENTS

Figure 1:
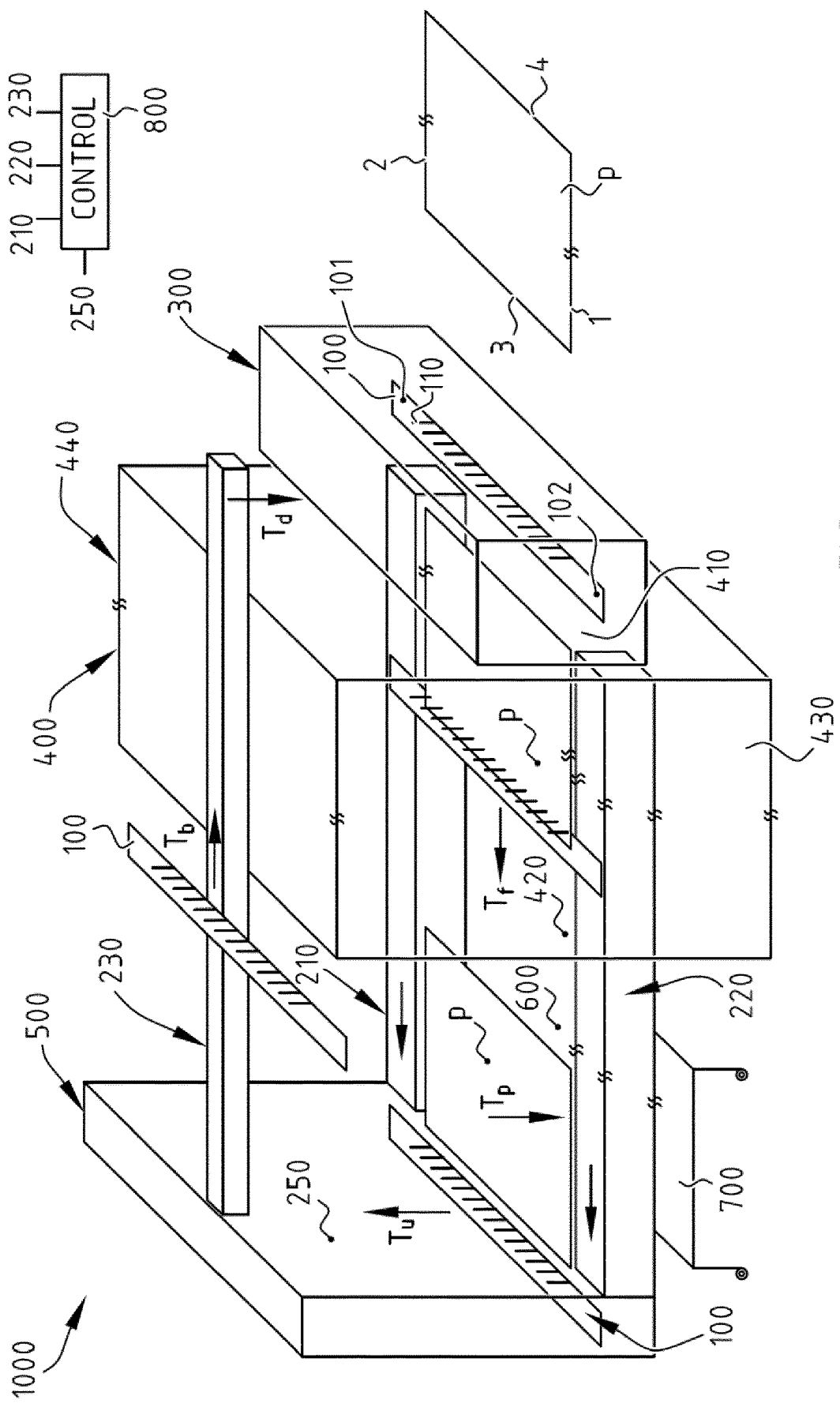
FIG. 1 is a schematic perspective view of an exemplary embodiment of an apparatus for treating a relief plate precursor.

FIG. 1 illustrates schematically an apparatus 1000 for treating a relief plate precursor, such as a printing plate precursor P. The apparatus is for instance a washing apparatus for washing a relief plate precursor with a liquid. However, also other treatments are possible such as brushing, rinsing, spraying, drying, irradiating, developing, heating, cooling, removing of material of the relief plate precursor, treating the relief plate precursor with gases or liquids, sanding the relief plate precursor, cutting the relief plate precursor, treating it with electromagnetic waves, or combinations thereof.

The apparatus 1000 comprises a transport system 210, 220, 230 with at least one, preferably at least two, and even more preferably at least three transport bars 100 intended to be coupled to a relief plate precursor. For example, four transport bars 100 may be provided to the transport system 210, 220, 230 as illustrated in FIG. 1. The transport bar 100 is coupled to a leading edge 3 of the relief plate precursor P and preferably extends over more than the entire length of the leading edge 3, such that end parts of the transport bar 100 can be coupled to a transport mechanism of the transport system 210, 220, see further. It is noted that it is also possible to couple a plurality of relief plate precursors to the transport bar 100. Preferably, the length of the transport bar 100 is between 100 mm and 1000 mm, more preferably between 1000 mm and 4000 mm.

The apparatus 1000 comprises a plate coupling station 300 configured for coupling a relief plate precursor P to a transport bar 100, a treatment compartment 400 configured for treating the relief plate precursor whilst the transport bar 100 to which the relief plate precursor P is coupled, is moved through the treatment compartment 400, and a plate decoupling station 500 configured for decoupling the treated relief plate precursor P from the transport bar 100. Preferably, the transport system 210, 220, 230 is configured to automatically move each transport bar 100, after being coupled to a relief plate precursor P in the plate coupling station 300, from the plate coupling station 300 through the treatment station 400 to the plate decoupling station 500, and, after being decoupled from a treated relief plate precursor P, from the plate decoupling station 500 back to the plate coupling station 300, such that the transport bar 100 moves in a closed loop through the apparatus 1000. In the illustrated example of FIG. 1, four transport bars 100 circulate in the apparatus 1000. However, the invention also cover embodiments where the transport bars are brought back manually from the plate decoupling station 500 to the plate coupling station 300.

Figure 5:
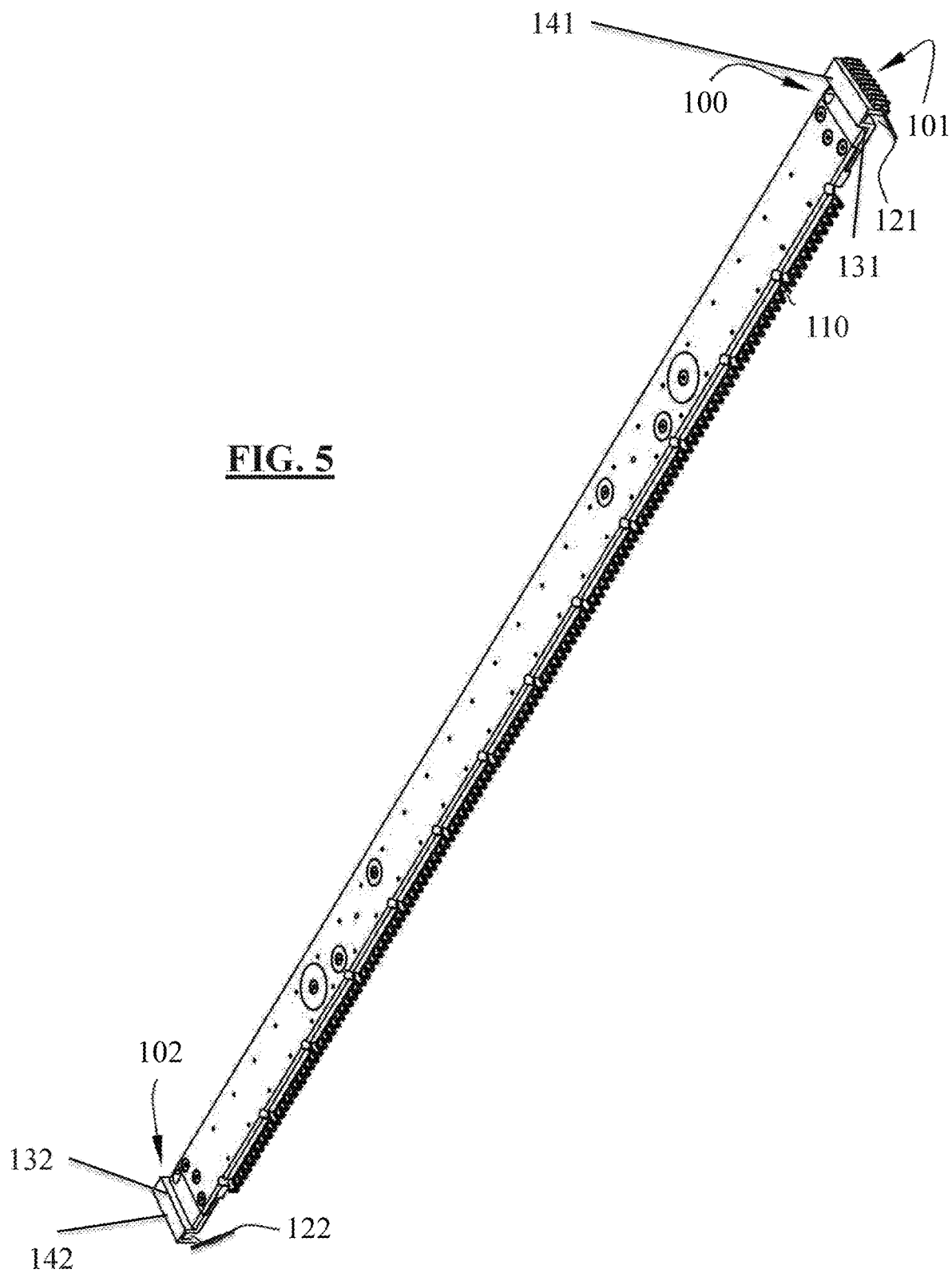
FIG. 5 is a schematic perspective view of an exemplary embodiment of a transport bar.

In a preferred embodiment, each transport bar 100 is provided with a plurality of penetration elements 110 (here in the form of pins or rods), and the plate coupling station 300 is configured to engage the plurality of penetration elements 110 in an area near the leading edge 3 of the relief plate precursor P. In FIG. 1, the relief plate precursor P has a leading edge 3, a trailing edge 4, both perpendicular to a forward transport direction Tf of the relief plate precursor P through the apparatus 1000, and two side edges 1, 2 parallel to the forward transport direction Tf. An area near the leading edge 3 of the relief plate precursor P is coupled to the plurality of penetration elements 110 of the transport bar 100. FIG. 5 illustrates a more detailed exemplary embodiment of a transport bar 100. The plurality of penetration elements 110 preferably have sharp tips, and the plate coupling station 300 is preferably configured to cause a penetration of the plurality of penetration elements 110 at least partially into or through an unperforated area near the leading edge 3 of the relief plate precursor P. However, it is noted that according to another exemplary embodiment, the apparatus 1000 of FIG. 1 may also be used with transport bars 100 which are provided with a plurality of penetration elements 110 which do not have a sharp tip. For example, the area near the leading edge 3 of the relief plate precursor P may be pre-perforated before bringing the relief plate precursor P to the plate coupling station 300, such that the plurality of penetration elements 110 can be arranged through pre-perforated holes in the area near the leading edge 3.

The treatment compartment 400 has an inlet side 410 and an outlet side 420. A transport bar 100 with a coupled relief plate precursor P is moved through the treatment compartment 400 from the inlet side 410 to the outlet side 420, wherein the transport bar 100 moves in the forward transport direction Tf. Between the outlet side 420 of the treatment compartment 400 and the plate decoupling station 500, there is provided a plate discharge zone 600. A relief plate precursor P is pulled by the transport system fully out of the treatment compartment 400 in the plate discharge zone 600 before being decoupled from the transport bar 100 in the decoupling station 500. In that way, when the relief plate precursor P is decoupled from the transport bar 100, the relief plate precursor P can be discharged in the plate discharge zone 600. At the bottom of the plate discharge zone 600 there may be provided a removal means configured to remove a treated relief plate precursor P after being decoupled from the transport bar 100 in the plate decoupling station 500. In the illustrated embodiment, the removal means 700 is a trolley configured for receiving the treated relief plate precursor P in the plate discharge zone 600, and for being moved out of the plate discharge zone 600, such that it can be easily transported away of the plate discharge zone. For example, if the apparatus 1000 is a washer, an operator may transport the washed relief plate precursor P to a dryer in order to dry the washed relief plate precursor. In other non illustrated embodiments, the removal means 700 may be a carrier, a robot, a moving belt, at least one rotating drum, etc. Also such devices can be configured to move a treated relief plate precursor P out of the plate discharge zone 600 after being decoupled in the plate decoupling station 500.

Figure 6:
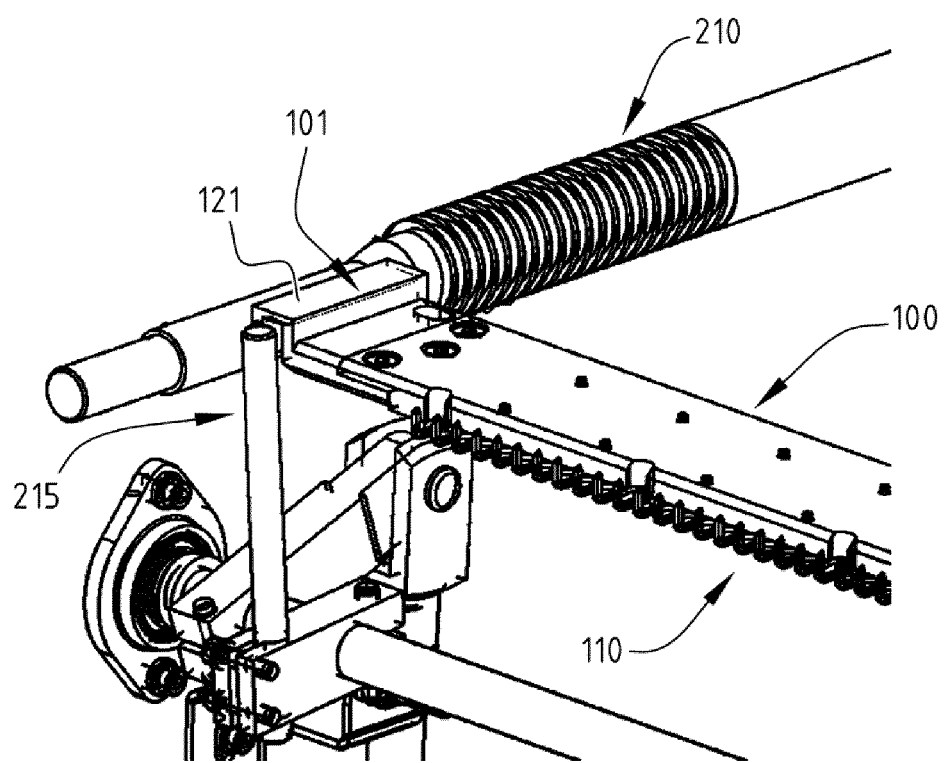
FIG. 6 is a detailed perspective view illustrating a portion of an exemplary embodiment of a plate coupling station.

In the embodiment of FIG. 1, the transport system comprises a forward transport mechanism which comprises first transport mechanism 210 on one side of the apparatus 1000, and a second transport mechanism 220 on the other side of the apparatus 1000. The transport mechanism 210, 220 is configured to transport the transport bar 100 with a coupled relief plate precursor P at least from the inlet side 410 to the outlet side 420 of the treatment compartment 400, and optionally from the outlet side 420 to the plate decoupling station 500, in the forward transport direction Tf. To that end, a first outer end 101 of the transport bar 100 is coupled with the first forward transport mechanism 210, and a second outer end 102 of the transport bar 100 is coupled with the second forward transport mechanism 220. As illustrated in FIG. 6, the transport system 210 may comprise a bar coupling means 215 configured to couple the transport bar 100, and more in particular the first outer end 101 and the second outer end 102 of the transport bar to the first and second forward transport mechanism 210, 220. Only the first outer end 101 and the first transport mechanism is shown in FIG. 6, but it is understood that the second outer end 102 and the second transport mechanism 220 may be embodied in a similar manner. The bar coupling means 215 may be configured e.g. for pushing or moving the transport bar 100 in the direction of the first and second forward transport mechanism, in order to cause a coupling of the outer ends 101 and 102 of the transport bar 100 to the forward transport mechanism 210, 220. In the embodiment of FIG. 1, the treatment compartment 400 has a first and second opposite lateral side 430, 440 extending in the forward transport direction Tf, and the first and second forward transport mechanism 210, 220 extend at the first and second opposite lateral side 430, 440 of the treatment compartment 400, respectively.

The transport system further comprises a backward transport mechanism 230 configured to transport the transport bar 100 from the plate decoupling station 500 back to the plate coupling station 300. In the illustrated embodiment of FIG. 1, the backward transport mechanism 230 is located at an upper side of the apparatus 1000. However, in other embodiments, the backward transport mechanism 230 could be arranged in a lower portion of the apparatus 1000, below the forward transport mechanism 210, 220. A backward transport mechanism 230 may comprise any one of the following: one or more belts, one or more chains, one or more lead screws, a linear motor, or combinations thereof. In FIG. 1, the backward transport mechanism 230 is arranged centrally above the treatment compartment 400. However, the backward transport mechanism 230 could also be realized with a first and second backward transport mechanism located at opposite lateral sides of the treatment compartment 400 above or below the first and second forward transport mechanism 210, 220. Alternatively, the backward transport mechanism may be located at a lateral side of the treatment compartment, and optionally the transport bar may be rotated and transported backward in a vertical position. However, in order to reduce the footprint of the apparatus the backward transport mechanism is preferably located above or below the first and second forward transport mechanism 210, 220. As illustrated in FIG. 1, the backward transport mechanism 230 is located partly above the treatment compartment 400, and the transport system further comprises an upward transport mechanism 250 configured to move a decoupled transport bar 100 in the plate decoupling station 500 upward towards the backward transport mechanism 230. For example, the upward transport mechanism 250 may move the transport bar 100 in an upward direction Tu, typically a vertical direction, towards the backward transport mechanism 230 which moves the transport bar 100 in a backward transport direction Tb opposite to the forward transport direction Tf, back to the plate coupling station 300. The upward transport mechanism 250 may comprise any one or more of the following: magnetic means, electromagnetic means, clamping means, vacuum means, linear motors, chains, belts, lead screws, piston or combinations thereof. In other embodiments where the backward transport mechanism 230 is located below the forward transport mechanism, there may be provided a downward transport mechanism. The downward transport mechanism may comprise any one or more of the following: magnetic means, electromagnetic means, clamping means, vacuum means, linear motors, chains, belts, lead screws, piston or combinations thereof, or occur simply by gravity.

FIG. 5 illustrates a more detailed exemplary embodiment of a transport bar 100. The transport bar 100 is provided with a first coupling portion 121 and a second coupling portion 122 at the first outer end 101 and the second outer end 102. In this case the coupling portions 121, 122 are configured with coupling means to be used in combination with a lead screw. The transport bar 100 is provided with penetration elements 110. The transport bar 100 is equipped with channels 120 allowing alignment pins to pass through the transport bar 100 from below the transport bar.

As illustrated in FIG. 6, in an exemplary embodiment, the first forward transport mechanism 210 comprises a first lead screw, and the first coupling portion 121 is configured to be coupled to the first lead screw 210. In a similar manner, the second forward transport mechanism 220 may be provided with a second lead screw which can be coupled to the second coupling portion 122. In other embodiments, the first and/or second forward transport mechanism 210, 220 may comprise other transport means such as a chain or belt, and the first and second coupling portions 121, 122 may be adapted accordingly.

FIGS. 2, 3A, 3B and 4 illustrate in detail an exemplary embodiment of an apparatus 1000 for treating a relief plate precursor with a liquid. The apparatus 100 comprises a treatment compartment 400 with a plurality of liquid application rollers 450 and a transport system 210. The treatment compartment 400 is configured for treating the relief plate precursor with a liquid. The transport system 210 is for use with one or more transport bars 100, e.g. a transport bar as described above in connection with FIG. 5. The transport system 210 is configured to move the transport bar 100 with the coupled relief plate precursor through the treatment compartment 400. The transport bar is provided with a coupling portion 121 configured to couple the transport bar 100 to the transport system 210, for example as described above in connection with FIG. 6. Further, the apparatus comprises a protection system 900 configured to guide and evacuate liquid on the transport bar such that the transport system is protected against wetting with the liquid of the treatment compartment. In that manner the relief plate precursor can be coupled to the penetration elements 110 of the transport bar 100, and the coupling portion 121 of the transport bar 100 can be coupled to the transport system 210. The transport system 210 is controlled, e.g. using a controller 800 as illustrated in FIG. 1, such that the transport bar 100 with the coupled relief plate precursor is moved through the treatment compartment 400 where the relief plate precursor is treated with a liquid. During this treatment, liquid is evacuated over the transport bar 100 towards a liquid evacuation part 900 whilst the transport bar 100 is moving through the treatment compartment 400, such that the liquid is evacuated before it can reach the transport system 210.

As is best visible in FIG. 3B and FIG. 4, the protection system 900 comprises a liquid evacuation part 910 extending lengthwise next to the transport system 210 and below the first outer end 101 of the transport bar 100. The liquid evacuation part 910 is provided with an upwardly extending portion 911 at a side facing the transport system 210 and with a substantially horizontal portion 913 on the side of the transport bar 100. This substantially horizontal portion 913 supports the transport bar 100 during its movement through the treatment compartment 400. In other embodiments the substantially horizontal portion 913 may be omitted and the transport bar 100 could be supported on the upwardly extending portion 911. The liquid evacuation part 910 may be made of a metal, an alloy, a plastic resistant to the liquid, or combinations thereof.

The transport bar 100 is provided at the first outer end 101 with an upwardly extending portion 131. The upwardly extending portion 911 of the liquid evacuation part 910 extends between the transport system 210 and the upwardly extending portion 131 of the transport bar 100. More in particular, in the embodiment of FIGS. 2-4, the transport bar 100 is provided at the first outer end 101 with an inverse-U-shaped portion having an outer leg forming the coupling portion 121 and an inner leg forming the upwardly extending portion 131. The outer leg 121 and the inner leg 131 are interconnected by a bridge portion 141 extending from the upwardly extending portion 131 of the transport bar 100 over the upwardly extending portion 911 of the liquid evacuation part to join the coupling portion 121. The upwardly extending portion 911 of the liquid evacuation part 910 extends between the outer and inner leg 121, 131 of the inverse-U-shaped portion.

Figure 3A:
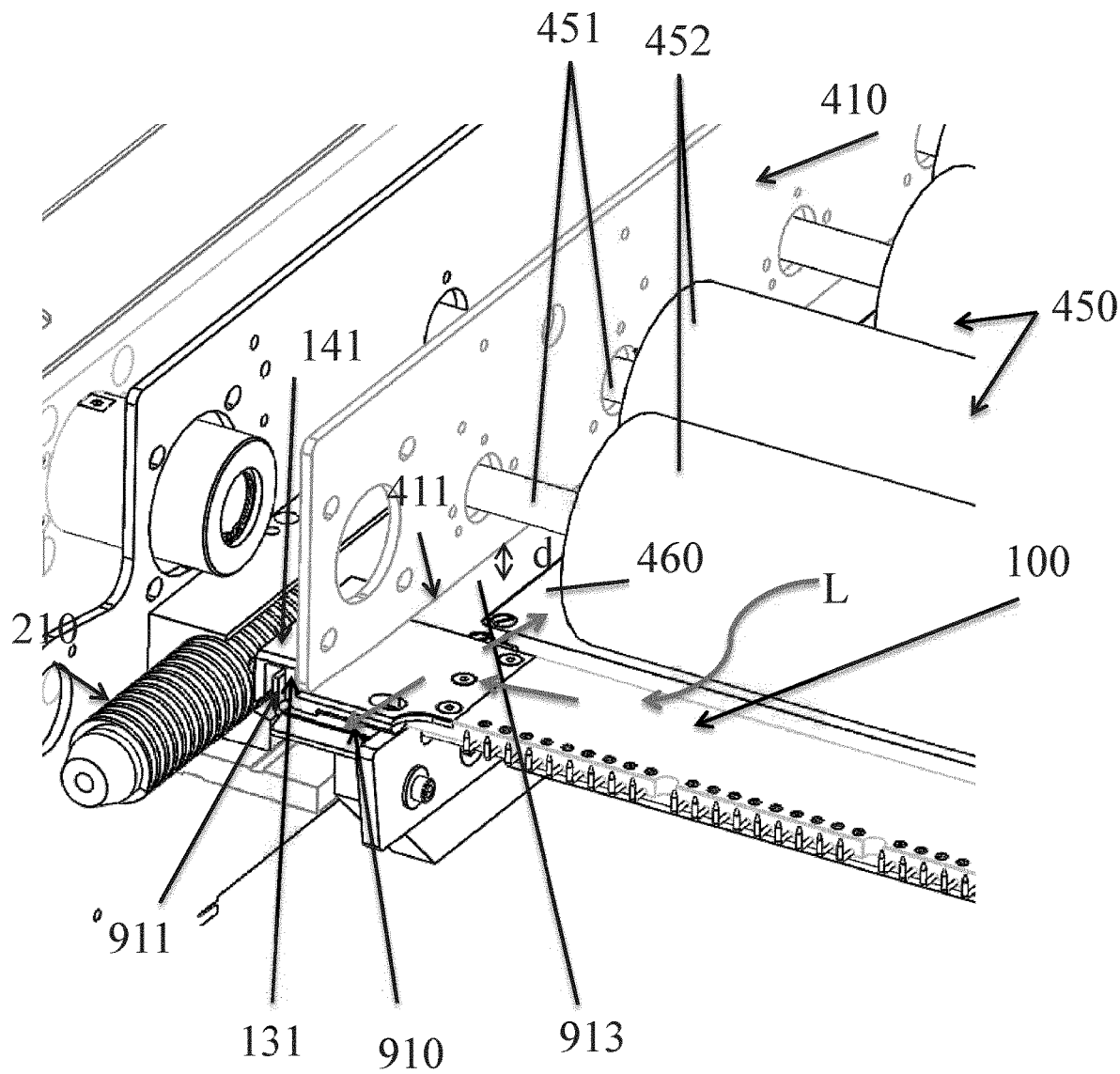
FIG. 3A is a detailed perspective view illustrating in detail a portion of FIG. 2, with the wall portion included.
Figure 3B:
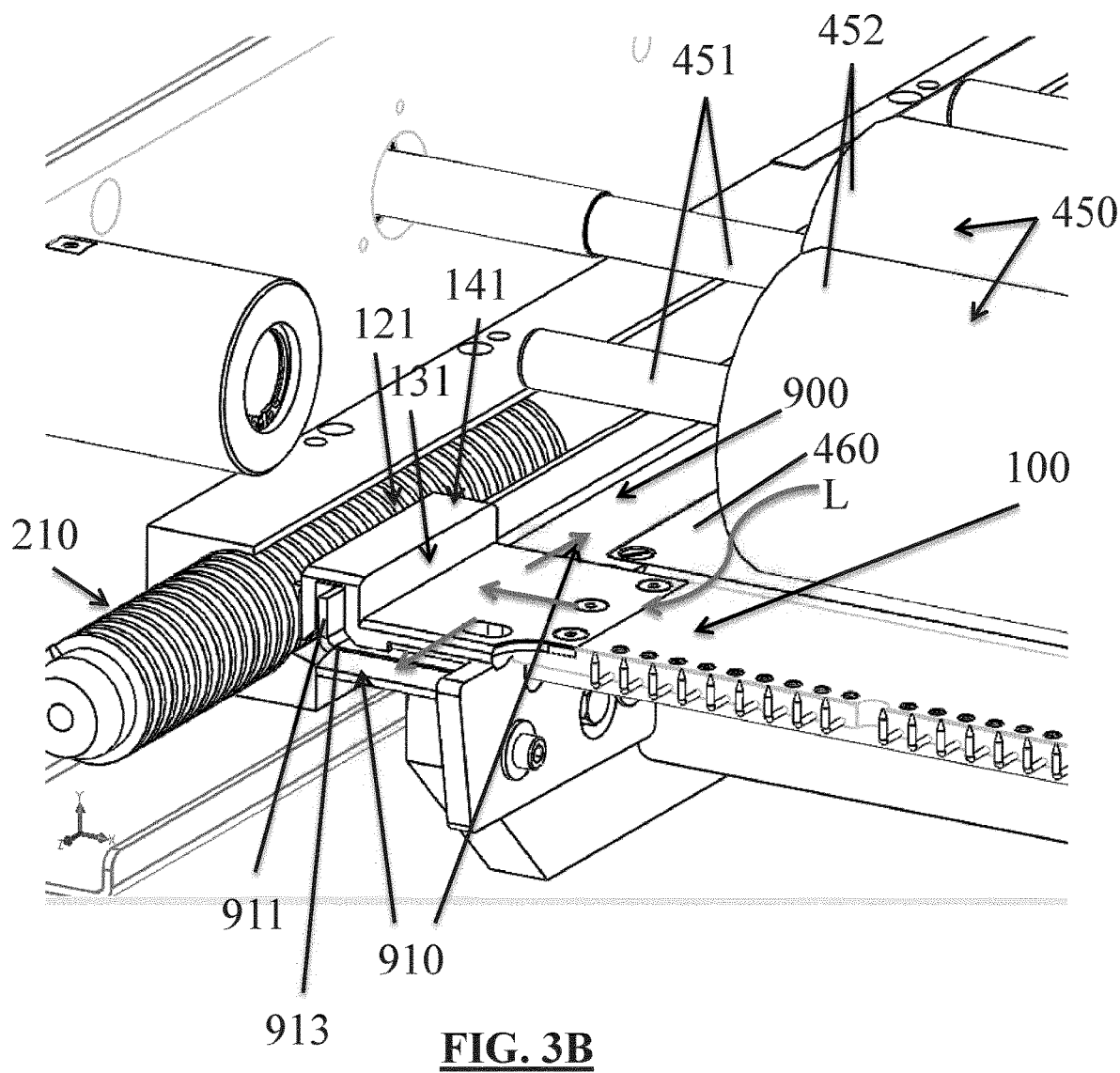
FIG. 3B is a detailed perspective view illustrating in detail a portion of FIG. 2.

As illustrated in FIG. 3B, liquid dropping from the liquid application rollers 450 on the transport bar 100 will be stopped at the upwardly extending portion 131 of the transport bar 100 and flow sideways onto the liquid evacuation part 910 where the liquid is stopped at the upwardly extending portion 911 of the liquid evacuation part 910. From there the liquid is evacuated to a lower reservoir (not shown). Also liquid falling directly on the liquid evacuation part 910 will not reach the transport mechanism 210 because of the upwardly extending portion 911 of the liquid evacuation part 910.

Figure 2:
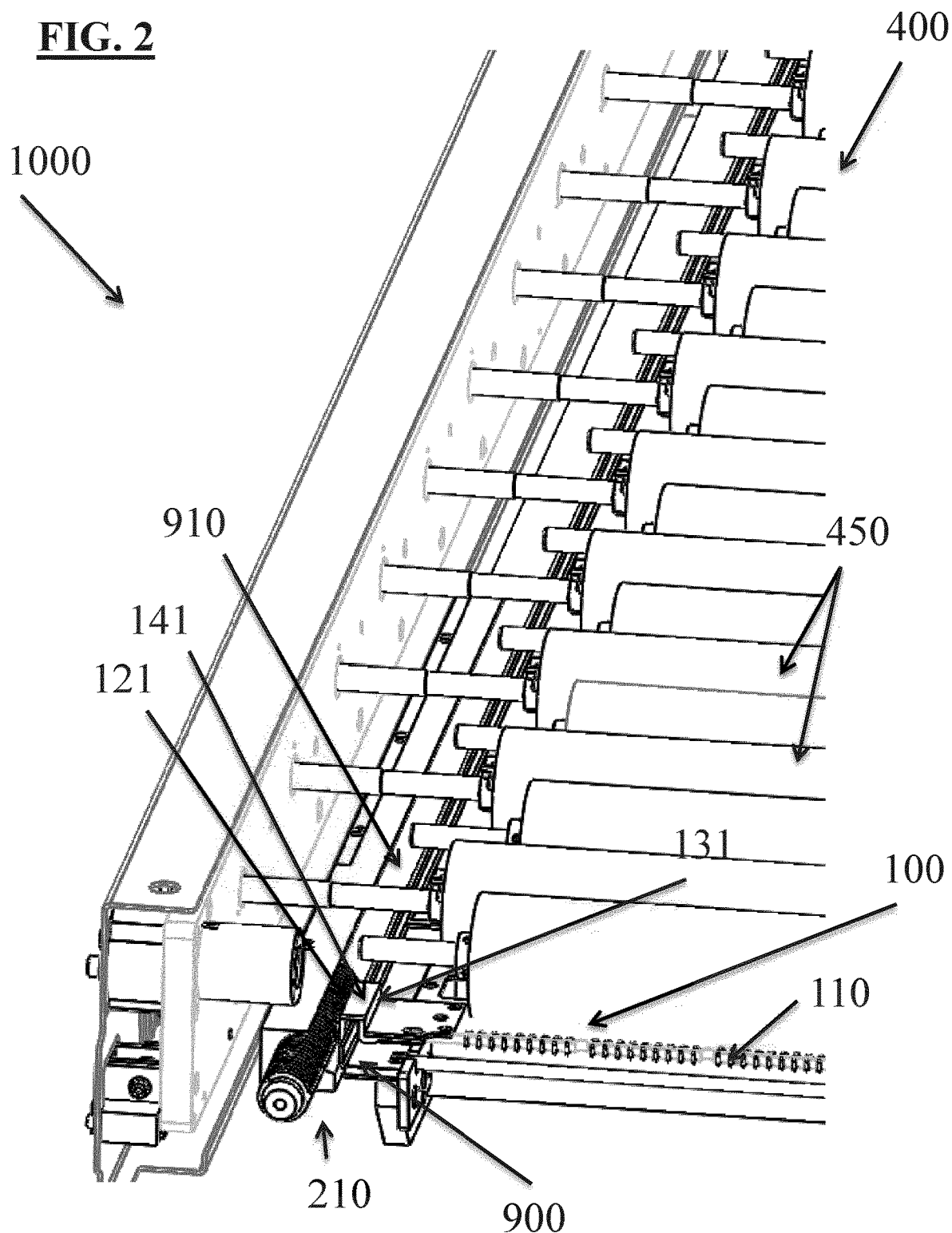
FIG. 2 is a perspective view of an exemplary embodiment of an apparatus for treating a relief plate precursor, wherein a wall portion has been omitted for clarity purposes.

As illustrated in FIG. 3A, the treatment compartment 400 comprises a wall portion 410 having a lower edge 411 right above the first outer end 101 of the transport bar 100, when the transport bar 100 moves through the treatment compartment 400. The lower edge 411 is shown to be located at a small distance d of the horizontal portion 913 of the liquid evacuation part 900, e.g. d<5 mm. This wall portion 410 has been omitted in FIGS. 2, 3B and 4 for clarity purposes. The wall portion 410 extends next to the upwardly extending portion 131 of the transport bar 100 such that an upper edge of the upwardly extending portion 131, located at the level of the bridge portion 141, is higher than the lower edge 411 of wall portion 410. The liquid evacuation part 910 extends below the lower edge 411 of the wall portion 410.

Figure 4:
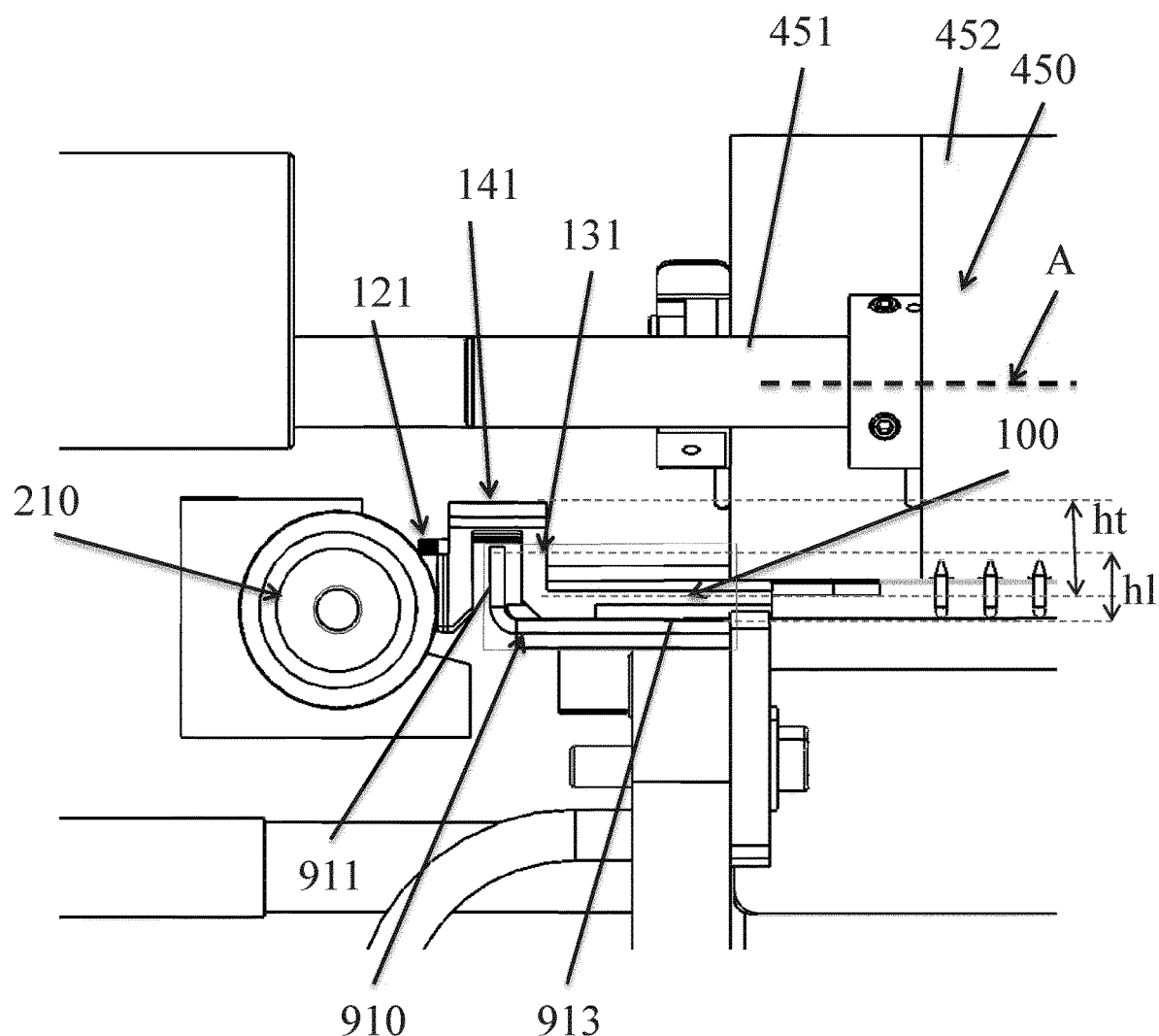
FIG. 4 is a side view of the exemplary embodiment of FIG. 2.

Although FIGS. 2-4 only illustrate the arrangement at the first outer end 101 of the transport bar 100, it will be understood that the arrangement at the second outer end 102 of the transport bar 100 may be similar. More in particular, as shown in FIG. 5, the second outer end 102 may be provided with an upwardly extending portion 132. The protection system 900 may comprises a second liquid evacuation part (not shown) below the second outer end 102, and extending lengthwise next to the second transport mechanism 220 of the transport system. Preferably, the second liquid evacuation part is provided with a second upwardly extending portion extending between the second transport mechanism 220 and the second upwardly extending portion 132 of the transport bar 100. In a preferred embodiment, the first and second transport mechanism 210, 200 may be a first and second lead screw.

The treatment compartment 400 comprises a plurality of liquid application rollers 450 having an axis A arranged parallel to the transport bar 100, see in particular FIG. 4. The first and second transport mechanism 210, 220 extend perpendicular on the axis A of the liquid application rollers 450, at a first and second side of the liquid application rollers 450, respectively. A coupling location between the transport bar 100 and the first and second transport mechanism 210, 220 is located lower than an upper side of the liquid application rollers 450, and in the illustrated embodiment lower than the axis A of the liquid application rollers 450. In that manner a very compact arrangement is achieved.

A liquid application roller 450 comprises a shaft 451 and a liquid application tool 452, such as bristles, arranged on the shaft 451, and the liquid evacuation part 910 extends below the transport bar 100 and below the shafts 451 of the liquid application rollers 450. Preferably, tables 460 are arranged below the liquid application rollers 450. The tables 460 may extend with an outer end thereof over the substantially horizontal portion 913 of the liquid evacuation part 910, as shown in FIGS. 3A and 3B. Optionally, the height of the tables 460 may be adjustable. By adjusting the height different operating modes may be set. For example, a smaller distance between the shaft 451 and the table 460 may be used in combination with a fast process leading to a lower quality compared to a higher distance in combination with a slower process. The table 460 is positioned at a lower level than an upper edge of the upwardly extending portion 911 of the liquid evacuation part 910, such that any liquid flowing from the table 460 on the liquid evacuation part 910 is stopped by the upwardly extending portion 911 of the liquid evacuation part 910.

Optionally, the transport bar 100 may be provided with one or more holes (not shown) for evacuating liquid through said one or more holes. For example, there may be arranged one or more holes between the upwardly extending portion 131 and a central portion of the transport bar 100, in an area located above the liquid evacuation part 910 or above the reservoir (not shown).

FIGS. 7A-7D illustrate four other exemplary embodiments of an apparatus for treating a relief plate precursor with a liquid, wherein similar components have been indicated with the same reference numerals as above.

Figure 7A:
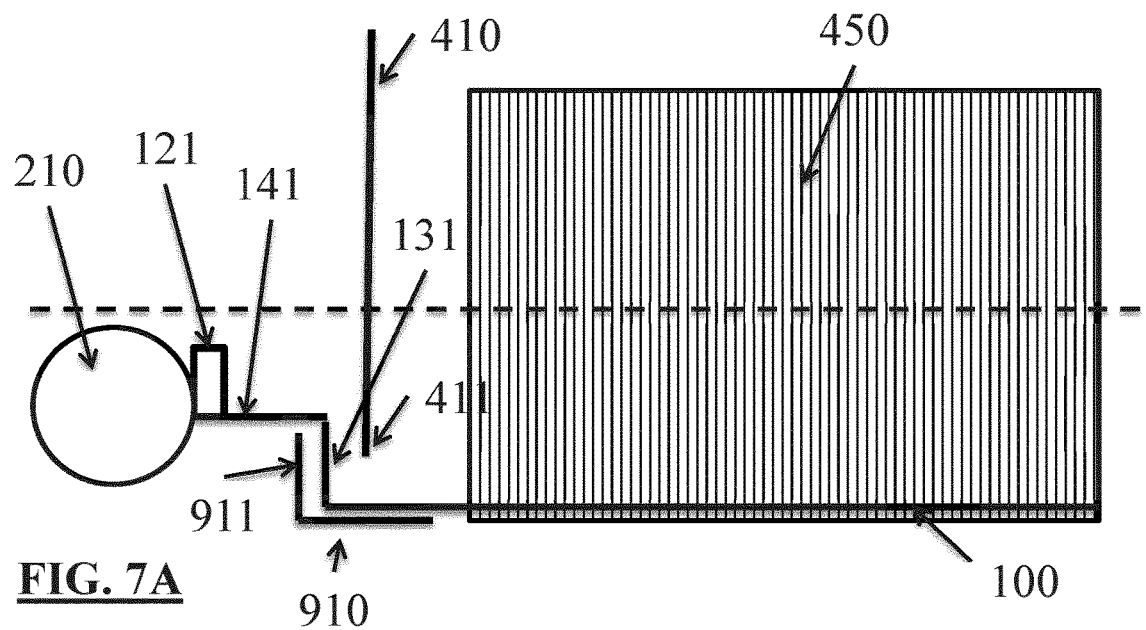

In the embodiment of FIG. 7A, the liquid evacuation part 910 is similar to the one described above in connection with FIGS. 2-4. The transport bar 100 is provided at the first outer end 101 with an upwardly extending portion 131, a bridge portion 141 extending over the upwardly extending portion 911 of the liquid evacuation part 910, and a coupling portion 121 extending upwardly from the bridge portion 141. As in the embodiment of FIGS. 2-4, a wall portion 410 extends next to the upwardly extending portion 131, with a lower edge 411 thereof being below the level of the bridge portion 141.

Figure 7B:
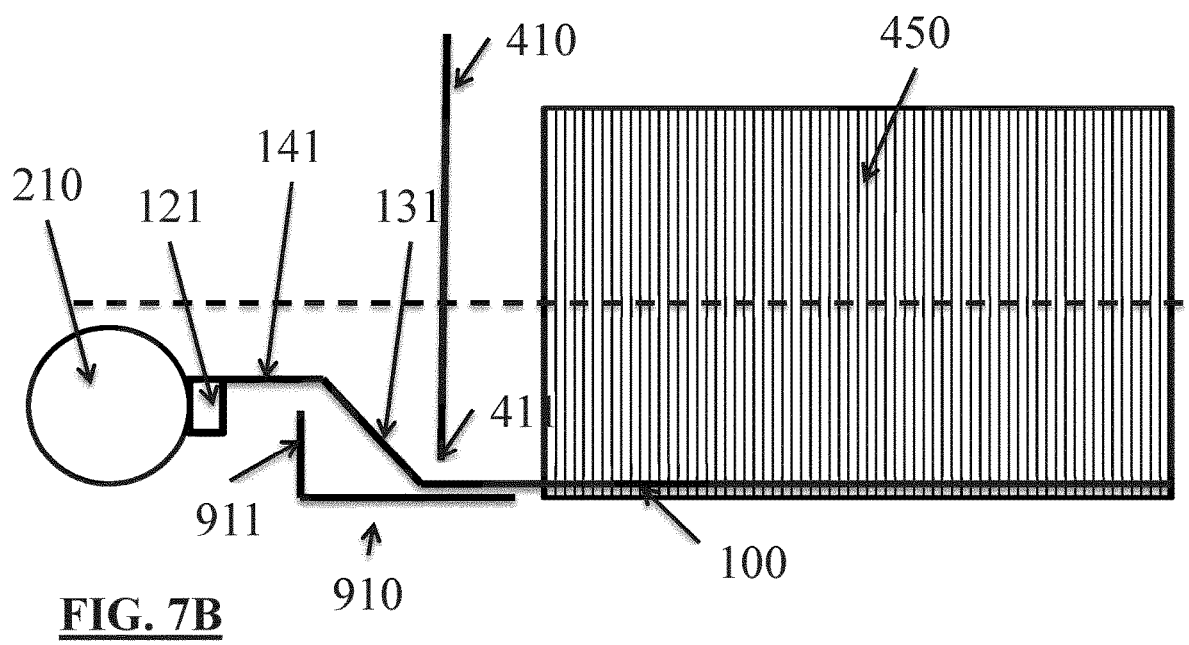

In the embodiment of FIG. 7B, the liquid evacuation part 910 is similar to the one described above in connection with FIGS. 2-4. The transport bar 100 is provided at the first outer end 101 with an upwardly extending portion 131, here sloping upwardly and not oriented vertically, a bridge portion 141 extending over the upwardly extending portion 911 of the liquid evacuation part 910, and a coupling portion 121 extending downwardly from the bridge portion 141. As in the embodiment of FIGS. 2-4, a wall portion 410 extends next to the upwardly extending portion 131, with a lower edge 411 thereof being below the level of the bridge portion 141.

In the embodiment of FIG. 7C, the liquid evacuation part 910 comprises an upwardly extending portion 911a, 911b with a vertical portion 911b at the side of the transport mechanism 210 and an inclined portion 911b protruding inwardly. The transport bar 100 is provided at the first outer end 101 with a V-shaped portion having a downwardly extending inner leg 136 and an outer leg forming the upwardly extending portion 131. The upwardly extending portion 911b of the liquid evacuation part 910 extends between the outer leg 131 of the V-shaped portion and the coupling portion 121. Further, a bridge portion 141 extends over the upwardly extending portion 911b of the liquid evacuation part 910. As in the embodiment of FIGS. 2-4, a wall portion 410 extends next to the upwardly extending portion 131, with a lower edge 411 thereof being below the level of the bridge portion 141. In this embodiment, the transport bar 100 is supported on the upwardly extending portion 911b of the liquid evacuation part 910. It is noted that portion 911a may also be omitted in the embodiment of FIG. 7C.

In the embodiment of FIG. 7D, the liquid evacuation part 910 comprises an upwardly extending portion 911a, 911b with a vertical portion 911b at the side of the transport mechanism 210 and an inclined portion 911b protruding inwardly. The transport bar 100 is provided at the first outer end 101 with a U-shaped portion having a downwardly extending inner leg 136 and an outer leg forming the upwardly extending portion 131. The upwardly extending portion 911b of the liquid evacuation part 910 extends between the outer leg 131 of the U-shaped portion and the coupling portion 121. Further, a bridge portion 141 extends over the upwardly extending portion 911b of the liquid evacuation part 910. As in the embodiment of FIGS. 2-4, wall portion 410 extends next to the upwardly extending portion 131, with a lower edge 411 thereof being below the level of the bridge portion 141. In this embodiment, the transport bar 100 is supported on the upwardly extending portion 911a of the liquid evacuation part 910.

Optionally, holes may be provided in the transport bars 100 illustrated in FIGS. 7A-7D. For example, in the embodiments of FIGS. 7C and 7D, holes may be provided in the V- or U-shaped portions.

A relief plate precursor generally comprises a support layer made of a first material and an additional layer made of a second material which is different from said first material. The support layer may be a flexible metal, a natural or artificial polymer, paper or combinations thereof. Preferably the support layer is a flexible metal or polymer film or sheet. In case of a flexible metal, the support layer could comprise a thin film, a sieve like structure, a mesh like structure, a woven or non-woven structure or a combination thereof. Steel, copper, nickel or aluminium sheets are preferred and may be about 50 to 1000 µm thick. In case of a polymer film, the film is dimensionally stable but bendable and may be made for example from polyalkylenes, polyesters, polyethylene terephthalate, polybutylene terephthalate, polyamides und polycarbonates, polymers reinforced with woven, nonwoven or layered fibres (e.g. glass fibres, Carbon fibres, polymer fibres) or combinations thereof. Preferably polyethylene and polyester foils are used and their thickness may be in the range of about 100 to 300 µm, preferably in the range of 100 to 200 µm.

A relief precursor may carry an additional layer. For example, the additional layer may be any one of the following: a direct engravable layer (e.g. by laser), a solvent or water developable layer, a thermally developable layer, a photosensitive layer, a combination of a photosensitive layer and a mask layer. Optionally there may be provided one or more further additional layers on top of additional layer. Such one or more further additional layers may comprise a cover layer at the top of all other layers which is removed before the imageable layer is imaged. The one or more additional layers may comprise a relief layer, and an antihalation layer between the support layer and the relief layer or at a side of the support layer which is opposite of the relief layer. The one or more additional layers may comprise a relief layer, an imageable layer, and one or more barrier layers between the relief layer and the imageable layer which prevent diffusion of oxygen. Between the different layers described above one or more adhesion layers may be located which ensure proper adhesion of the different layers.

In a preferred embodiment the relief plate precursor comprises a support layer made of a polyester of polymer material, and an additional layer made of a directly engravable material such as a resin material. The optional layer may then be a laser ablative layer. In an exemplary embodiment the relief plate precursor may contain at least a dimensionally stable support layer, a relief layer and an imageable mask layer. Optionally, further layers may be present. There may be a cover layer at the top of all other layers which is removed before the imageable mask layer is imaged. There may be an anti-halation layer between the support layer and the relief layer or it may be located at the side of the support layer which is opposite of the relief layer. There may be one or more barrier layers between the relief layer and the imageable mask layer which prevent diffusion of oxygen. Between the different layers described above one or more adhesion layers may be located which ensure proper adhesion of the different layers. One or more layers may be removable by treatment with a liquid. The liquids used may be the same or different for different layers. Preferably the liquids used are different.

In a preferred embodiment the relief plate precursor comprises a photosensitive layer and a mask layer. The mask layer may be ablated or changed in transparency during the treatment and forms a mask with transparent and non-transparent areas. Underneath of transparent areas of the mask the photosensitive layer undergoes a change in solubility and/or fluidity upon irradiation. The change is used to generate the relief by removing parts of the photosensitive layer in one or more subsequent steps. The change in solubility and/or fluidity may be achieved by photo-induced polymerization and/or crosslinking, rendering the irradiated areas less soluble. In other cases the electromagnetic radiation may cause breaking of bonds or cleavage of protective groups rendering the irradiated areas more soluble. Preferably a process using photo-induced crosslinking and/or polymerization is used.

Whilst the principles of the invention have been set out above in connection with specific embodiments, it is to be understood that this description is merely made by way of example and not as a limitation of the scope of protection which is determined by the appended claims.

The invention claimed is:

1. An apparatus for treating a relief plate precursor with a liquid, comprising:
   a treatment compartment configured for treating the relief plate precursor with a liquid;
   a transport system for use with one or more transport bars, wherein a transport bar thereof is configured to be coupled to a relief plate precursor, said transport system being configured to move the transport bar with the coupled relief plate precursor through the treatment compartment; and said transport bar being provided with a coupling portion configured to couple the transport bar to the transport system; and
   a protection system configured to guide and evacuate liquid such that the transport system is protected against wetting with the liquid of the treatment compartment;
   wherein the protection system comprises a liquid evacuation part extending lengthwise next to the transport system and below an outer end of the transport bar, said liquid evacuation part being provided with an upwardly extending portion at a side facing the transport system; and
   wherein the outer end of the transport bar is supported on the liquid evacuation part.

2. The apparatus according to claim 1, wherein the transport bar is provided at the outer end with an upwardly extending portion, and wherein the upwardly extending portion of the liquid evacuation part extends between the transport system and the upwardly extending portion of the transport bar.

3. The apparatus according to claim 1, wherein the treatment compartment comprises a wall portion having a lower edge right above the outer end of the transport bar, when the transport bar moves through the treatment compartment.

4. The apparatus according to claim 2, wherein the treatment compartment comprises a wall portion having a lower edge right above the outer end of the transport bar, when the transport bar moves through the treatment compartment; and wherein the wall portion extends next to the upwardly extending portion of the transport bar such that an upper edge of the upwardly extending portion is higher than the lower edge of wall portion.

5. The apparatus of claim 1, wherein the treatment compartment comprises a wall portion having a lower edge right above the outer end of the transport bar, when the transport bar moves through the treatment compartment; and wherein the liquid evacuation part extends below the lower edge of the wall portion.

6. The apparatus according to claim 2, wherein the transport bar comprises a bridge portion extending from the upwardly extending portion of the transport bar over the upwardly extending portion of the liquid evacuation part to join the coupling portion.

7. The apparatus according to claim 1, wherein the transport bar is provided at a first and a second outer end with a first and second upwardly extending portion, respectively, and wherein the protection system comprises a first and a second liquid evacuation part below the first and the second outer end, respectively, and extending lengthwise next to a first and second transport mechanism of the transport system, respectively.

8. The apparatus according to claim 1, wherein the transport system comprises a lead screw, or a chain or belt.

9. The apparatus according to claim 1, wherein the treatment compartment comprises a plurality of liquid application means having an axis arranged parallel to the transport bar, and wherein the transport system comprises a first and a second transport mechanism extending perpendicular on the axis of the liquid application means, at a first and second side of the liquid application means, respectively, wherein a coupling location between the transport bar and the first and second transport mechanism is located lower than an upper side of the liquid application means.

10. The apparatus according to claim 1, wherein the treatment compartment comprises a plurality of liquid application means having an axis arranged parallel to the transport bar, and wherein the transport system comprises a first and a second transport mechanism extending perpendicular on the axis of the liquid application means, at a first and second side of the liquid application means, respectively, wherein a coupling location between the transport bar and the first and second transport mechanism is located lower than an upper side of the liquid application means; and wherein the liquid application means comprises a shaft and a liquid application tool, such as bristles, arranged on the shaft, and wherein the liquid evacuation part extends below the transport bar and below the shafts of the liquid application means.

11. The apparatus according to claim 1, wherein the transport bar is provided with one or more holes for evacuating liquid through said one or more holes.

12. The apparatus according to claim 1, wherein the transport bar is provided with at least one penetration element.

13. The apparatus according to claim 1, further comprising a plate coupling station and/or decoupling station configured for coupling and/or decoupling the relief plate precursor to or from the transport bar; and/or wherein the transport system is configured to move the at least two transport bars in a closed loop through the apparatus.

14. An apparatus for treating a relief plate precursor with a liquid, comprising:
a treatment compartment configured for treating the relief plate precursor with a liquid;
a transport system for use with one or more transport bars, wherein a transport bar thereof is configured to be coupled to a relief plate precursor, said transport system being configured to move the transport bar with the coupled relief plate precursor through the treatment compartment; and said transport bar being provided with a coupling portion configured to couple the transport bar to the transport system; and
a protection system configured to guide and evacuate liquid such that the transport system is protected against wetting with the liquid of the treatment compartment;
wherein the protection system comprises a liquid evacuation part extending lengthwise next to the transport system and below an outer end of the transport bar, said liquid evacuation part being provided with an upwardly extending portion at a side facing the transport system;
wherein the transport bar is provided at the outer end with an upwardly extending portion, and wherein the upwardly extending portion of the liquid evacuation part extends between the transport system and the upwardly extending portion of the transport bar; and
wherein the transport bar is provided at the outer end with an inverse-U-shaped portion having an outer leg forming the coupling portion and an inner leg forming the upwardly extending portion, and wherein the upwardly extending portion of the liquid evacuation part extends between the outer and inner leg of the inverse-U-shaped portion.

15. The apparatus according to claim 14, wherein the treatment compartment comprises a wall portion having a lower edge right above the outer end of the transport bar, when the transport bar moves through the treatment compartment.

16. The apparatus according to claim 14, wherein the treatment compartment comprises a wall portion having a lower edge right above the outer end of the transport bar, when the transport bar moves through the treatment compartment; and wherein the wall portion extends next to the upwardly extending portion of the transport bar such that an upper edge of the upwardly extending portion is higher than the lower edge of wall portion.

17. An apparatus for treating a relief plate precursor with a liquid, comprising:
a treatment compartment configured for treating the relief plate precursor with a liquid;
a transport system for use with one or more transport bars, wherein a transport bar thereof is configured to be coupled to a relief plate precursor, said transport system being configured to move the transport bar with the coupled relief plate precursor through the treatment compartment; and said transport bar being provided with a coupling portion configured to couple the transport bar to the transport system; and
a protection system configured to guide and evacuate liquid such that the transport system is protected against wetting with the liquid of the treatment compartment;
wherein the protection system comprises a liquid evacuation part extending lengthwise next to the transport system and below an outer end of the transport bar, said liquid evacuation part being provided with an upwardly extending portion at a side facing the transport system;
wherein the transport bar is provided at the outer end with an upwardly extending portion, and wherein the upwardly extending portion of the liquid evacuation part extends between the transport system and the upwardly extending portion of the transport bar; and
wherein the transport bar is provided at the outer end with a substantially U- or V-shaped portion having a downwardly extending inner leg and an outer leg forming the upwardly extending portion, and wherein the upwardly extending portion of the liquid evacuation part extends between the outer leg of the substantially U- or V-shaped portion and the coupling portion.

18. The apparatus according to claim 17, wherein the treatment compartment comprises a wall portion having a lower edge right above the outer end of the transport bar, when the transport bar moves through the treatment compartment.

19. The apparatus according to claim 17, wherein the treatment compartment comprises a wall portion having a lower edge right above the outer end of the transport bar, when the transport bar moves through the treatment compartment; and wherein the wall portion extends next to the upwardly extending portion of the transport bar such that an upper edge of the upwardly extending portion is higher than the lower edge of wall portion.

\* \* \* \* \*